United States Patent

Ho et al.

[11] Patent Number: 5,674,775
[45] Date of Patent: Oct. 7, 1997

[54] ISOLATION TRENCH WITH A ROUNDED TOP EDGE USING AN ETCH BUFFER LAYER

[75] Inventors: Chin-Hsiung Ho, Sunnyvale, Calif.; Chia-Shiung Tsai; Cheng-Kai Liu, both of Hsin-Chu, Taiwan; Chaochieh Tsai, Taichung, Taiwan

[73] Assignee: Taiwan Semiconductor Manufacturing Company, Ltd., Hsin-Chu, Taiwan

[21] Appl. No.: 803,466

[22] Filed: Feb. 20, 1997

[51] Int. Cl.$^6$ ................................................. H01L 21/76
[52] U.S. Cl. ............................... 437/67; 437/61; 437/62; 437/228 S; 148/DIG. 50
[58] Field of Search ..................... 437/67, 61, 62, 437/63, 72, 228 S; 148/DIG. 50

[56] References Cited

U.S. PATENT DOCUMENTS

| | | | |
|---|---|---|---|
| 4,729,815 | 3/1988 | Leung | 156/643 |
| 4,845,048 | 7/1989 | Tamaki et al. | 437/67 |
| 4,857,477 | 8/1989 | Kanamori | 437/47 |
| 4,980,311 | 12/1990 | Namose | 437/67 |
| 5,464,794 | 11/1995 | Lur et al. | 437/187 |

FOREIGN PATENT DOCUMENTS 0271620 11/1990 Japan.

*Primary Examiner*—Trung Dang
*Attorney, Agent, or Firm*—George O. Saile; Stephen B. Ackerman; William J. Stoffel

[57] ABSTRACT

The present invention provides a method of manufacturing a trench having rounded top corners 28 in a substrate. The rounded top edges allow the formation of a gate oxide with a uniform thickness around the trench thereby reducing parasitic field FET problems. The method begins by forming a pad layer 14 over a semiconductor substrate 10. Next, an insulating layer 18 composed of silicon nitride is formed over the pad layer 14. A first opening 19 is formed in the insulating layer 18 and the pad layer 14 exposing the surface of the substrate. The first opening is defined by sidewalls of the pad layer 14 and of the insulating layer 18. An etch buffer layer 20 composed of polysilicon is formed over the resultant surface. In one etch step, the etch buffer layer 20 is anisotropically etched forming spacers 22 on the sidewalls of the pad layer 14 and of the insulating layer 18. The same etch step continues by etching the spacers 22 and the exposed substrate in the first opening 19 thereby forming a trench 26 in the substrate 10. Because the etch has to etch through the spacers before it reached the substrate, the trench 26 has rounded top edges 28 near the pad layer 14. Lastly, the pad layer 14 and the first insulating layer 18 are removed thereby forming the trench 26 with rounded top edges 28.

14 Claims, 5 Drawing Sheets

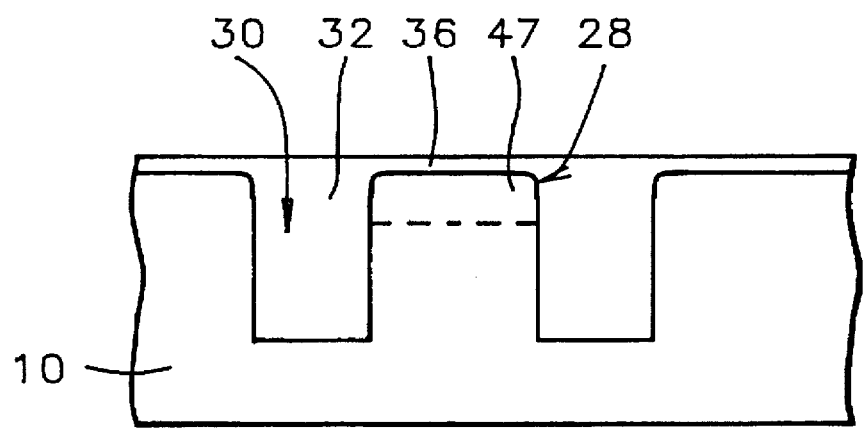
FIG. 6
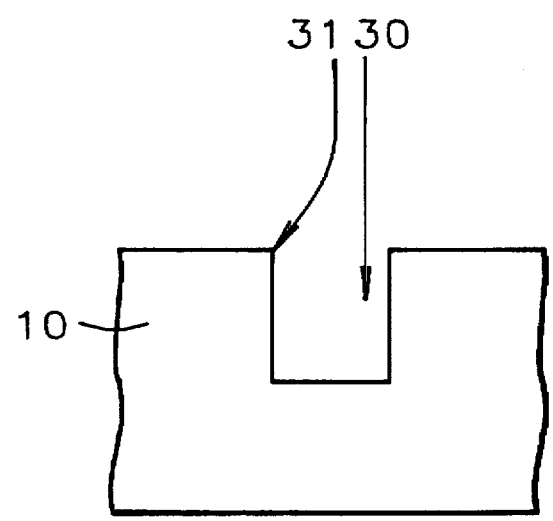
FIG. 7 - Prior Art

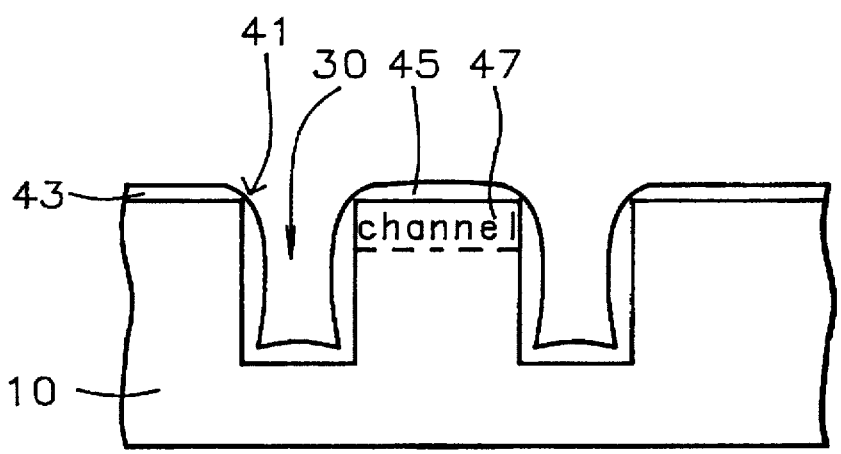
*FIG. 8 - Prior Art*
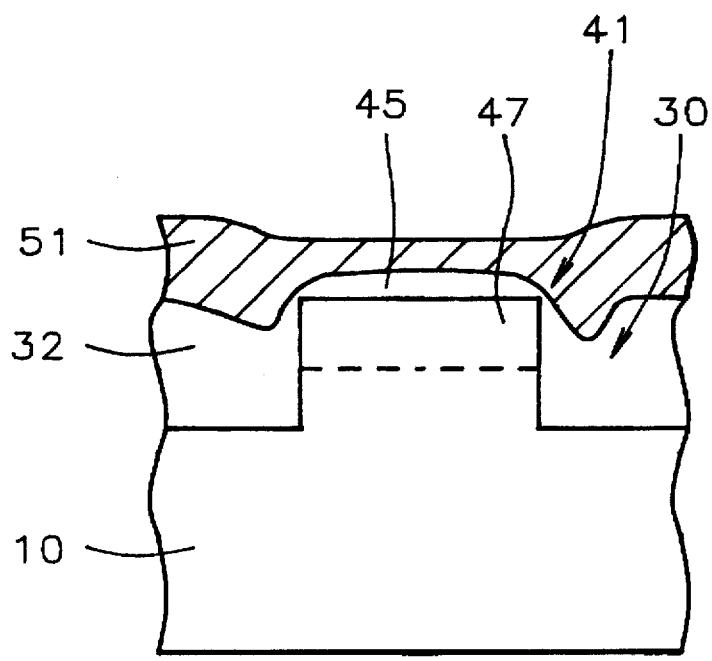
*FIG. 9A - Prior Art*

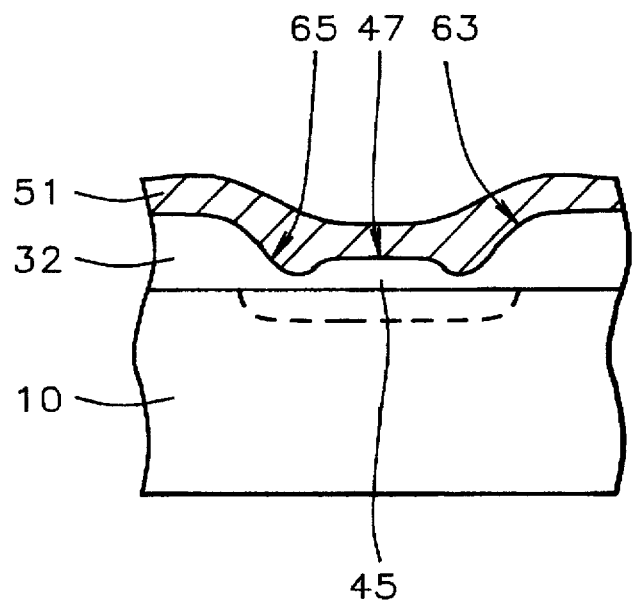
*FIG. 9B — Prior Art*
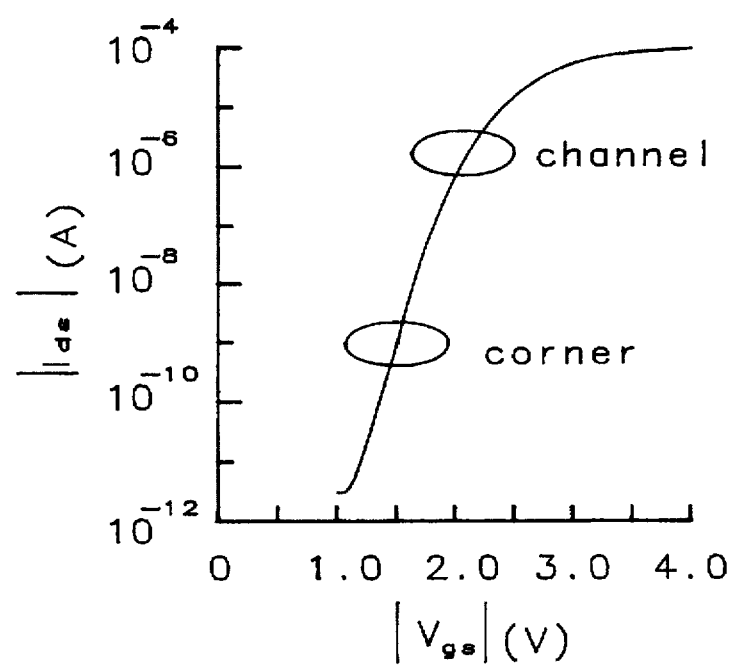
*FIG. 10*

ISOLATION TRENCH WITH A ROUNDED TOP EDGE USING AN ETCH BUFFER LAYER

BACKGROUND OF THE INVENTION

1) Field of the Invention

This invention relates generally to processes to form isolation regions in semiconductor devices and particularly to the fabrication of shallow trenches for isolation regions in semiconductor devices and more particularly to a process to form shallow trench isolation (STI).

2) Description of the Prior Art

The fabrication of an integrated circuit normally begins by processing the semiconductor substrate to divide the surface area into regions where active devices and substrate embedded interconnects are to be formed, and other regions of dielectric which electrically separate the active device regions. The field oxide dielectric material is routinely silicon dioxide. Though various field oxide formation techniques have been developed and described, the technique commonly known as the localized oxidation of silicon (LOCOS) remains common in the semiconductor industry. In the practice of LOCOS, the active regions of the silicon substrate are masked by a silicon nitride layer, while the field oxide regions are thermally oxidized to form a field dielectric region. Though fundamentally simple and efficient, the LOCOS process and its progeny, such as the FUROX, PBL, and SWAMI techniques, exhibit deficiencies which reduce yield or performance in the final semiconductor chip product. The LOCOS techniques and other related techniques, suffer from bird's beak and channel-stop encroachment.

To overcome some of the limitations of the LOCOS process, the shallow trench and refill isolation (STI—shallow trench isolation) structure was developed. As shown in FIG. 7, the conventional STI process starts by etching a relatively shallow trench into a silicon substrate. The trench can be etched using a dry anisotropic etch, which produces a precise trench pattern, but also produces square top edges 31 as shown in FIG. 7. A thin oxide layer is then formed in the trench 30 and the trench is refilled with an insulator material. The trench is planarized after refill to complete the STI structure. Because the bird's beak problem is not present and channel-stop dopant redistribution is reduced, smaller isolation spacing is possible than with LOCOS.

However, we have found that the present STI structure 30 having sharp top edges 31 induces thinner non-uniform gate oxide near the shallow trench isolation (STI). This thin gate oxide helps form parasitic field FET's as shown in FIG. 8. The thinner oxide 41 forms at the trench corner 31 due to stress concentration. FIG. 8 depicts a two dimensional cross section, where the drain of the MOSFET would be located along the third dimension. Traditional hot carrier degradation could occur in this dimension and device damage would result. The damaged region would be located along the third dimension bordering the drain, corner and polysilicon gate intersection. FIG. 9A shows a cross section through the width of a shallow trench 30. The dashed line is the location of the BC-PFET channel junction. The poly 51 recess at the device edges is the gate wraparound. The poly-gate 51 overlies the channel 47. FIG. 9B shows a cross section of the equivalent planar structure of the device shown in FIG. 9A. The locations of the equivalent corner 65 and sidewall 63 for the equivalent planar structure is shown in FIG. 9B. We have found that the thin oxide 41 in the trench corner 31 and the oxide 45 over the channel 47 have different electrically characteristics and create the "double hump" $I_{ds}$-$V_{gs}$ (two regions—corner and sidewall) similar to as shown in FIG. 10. The two regions are caused by the two different effective oxide thicknesses at the corner and over the channel. A distinctive feature of the corner characteristic is a subthreshold slope that is steeper that the channel slope. The corner device can be interpreted as having a thinner effective oxide thickness than the corresponding planar channel oxide thickness. See FIG. 9B.

Practitioners have attempted to solve other different problems of sharp edges on semiconductor devices. For example, U.S. Pat. No. 4,857,477 (Kanamori) shows a method of forming a trench for a capacitor with rounded corners by using a two mask etch process where the second mask opening is larger than the first mask opening. Also, U.S. Pat. No. 5,464,794 (Lur et at.) shows a method of forming a contact opening having a curved edge. The invention uses an etch and reflow process. A second embodiment uses two materials with different etch rates. However, the problem of sharp trench edges for isolation is still a major problem. A new process to produce a narrow trench isolation with rounded top corners is needed.

SUMMARY OF THE INVENTION

It is an object of the present invention to provide a method for fabricating a shallow trench having rounded top edges in a semiconductor substrate.

It is an object of the present invention to provide a method for fabricating a shallow trench having rounded top edges and bottom sharp edges in a semiconductor substrate.

It is an object of the present invention to provide a method for fabricating a shallow trench isolation, overlaying gate oxide and field effect transistors where the gate oxide has a uniform thickness near the shallow trench isolation.

It is an object of the present invention to provide a method for fabricating a shallow trench isolation, overlaying gate oxide and surface channel (sc) and buffed channel (BC) field effect transistors where the gate oxide has a uniform thickness near the shallow trench isolation.

It is an object of the present invention to provide a method for fabricating a shallow trench isolation having a rounded top corner edge to eliminate the occurrence of the "double hump" in the $I_{ds}$-$V_{gs}$ characteristics, including both PMOS and NMOS devices.

To accomplish the above objectives, the present invention provides a method of manufacturing a trench having rounded top edges (corners) in a substrate. The method begins by forming a pad oxide layer 14 over a semiconductor substrate 10. Next, an insulating layer 18 composed of silicon nitride is formed over the pad oxide layer 14. A first opening 19 is formed in the insulating layer 18 and the pad oxide layer 14 exposing the surface of the substrate. The first opening is defined by sidewalls of the pad oxide layer 14 and of the insulating layer 18.

A etch buffer layer 20 preferably composed of polysilicon is formed over the resultant surface. The etch buffer layer 20 composed of polysilicon preferably has a thickness in a range of between about 300 and 500 Å. In one etch step, the etch buffer layer 20 is anisotropically etched forming spacers 22 on the sidewalls of the pad oxide layer 14 and of the insulating layer 18. The same etch step continues by etching the spacer 22 and the exposed substrate in the first opening 19 thereby forming a trench 26 in the substrate 10. Because the etch has to etch through the spacers 22 before it reached the substrate, the trench 26 has rounded top edges 28 near the pad oxide layer 14. Lastly, the pad oxide layer 14 and the first insulating layer 18 are removed thereby forming the trench 26 with rounded top edges 28.

The present invention provides an improved method to form a trench with rounded top edges. The rounded top edges (corners) allow proper formation of gate oxide around the trench and reduce parasitic field FET problems. The method is inexpensive to implement and reliable to manufacture. The present invention maintains the sharp lower trench corners that improve isolation efficiency due to the so-called "corner effect". This is the field lines at the bottom corners of the trench spread out at the vicinity of the corner, leading to a high threshold at the corners. The invention also provides a smother sidewall profile.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 6 are cross sectional views for illustrating a method for forming a trench with rounded top corners in a substrate according to the present invention.

FIGS. 7 and 8 are cross sectional views of a trench with sharp (square) top corner formed by the prior art process.

FIG. 9A is a cross section through the width of a shallow trench bounded MOSFET having the sharp top trench corners and thin oxide 41 of the prior art.

FIG. 9B is a cross sectional view of the equivalent planar FET of the device shown in FIG. 9A having thin oxide.

FIG. 10 is a graph the showing the "double hump" $I_{ds}$-$V_{gs}$ (two regions—corner and sidewall) problem caused by the thin oxide 41 over the sharp trench corners of the prior art.

DETAILED DESCRIPTION OF THE PREFERRED EMBODIMENTS

The present invention will be described in detail with reference to the accompanying drawings. The present invention provides a method of manufacturing a trench having rounded top edges while having sharp bottom edges (corners) in a substrate. It should be also understood that the figures depict only one trench out of a multitude of trenches that are fabricated simultaneously on the substrate.

Figure 1:
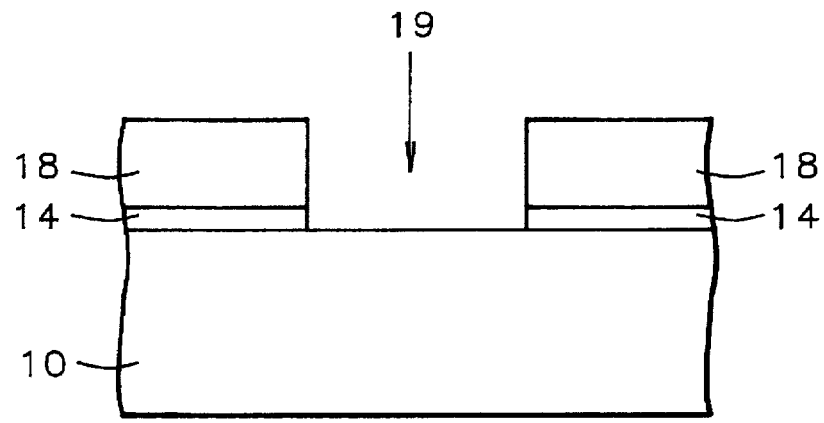

The method begins by forming a pad layer 14 preferably composed of silicon oxide over a semiconductor substrate 10 as shown in FIG. 1. The substrate is preferably formed of p-type semiconductor silicon having a crystal orientation of (100). The substrate is understood to possibly include a semiconductor wafer, active and passive devices formed within the wafer and layers formed on the wafer surface. The substrate includes at least isolation areas where the shallow trench isolation (STI) is formed and active areas where devices are formed.

The pad oxide layer is preferably formed using a conventional thermal oxidation process. The pad oxide layer 14 preferably has thickness in a range of between about 70 and 120 Å.

Still referring to FIG. 1, an insulating layer 18 is formed over the pad oxide layer 14. The insulating layer can be composed of aluminum oxide, aluminum nitride, and silicon nitride, and is more preferably composed of silicon nitride. A silicon nitride insulating layer can be formed by (1) reacting silane and ammonia at atmospheric pressure at 700° to 900° C., or by (2) reacting dichlorosilane and ammonia at reduced pressure at approximately 700° C. Also, silicon nitride can be formed by (3) plasma enhance chemical vapor deposition by reacting silane with ammonia or nitrogen in a glow discharge between 200° and 350° C. The insulating layer of nitride is preferably made of using the reduced pressure dichlorosilane and ammonia method. The insulating layer 18 preferably has a thickness in a range of between about 1000 and 2000 Å.

Still referring to FIG. 1, a first opening 19 is formed in the insulating layer 18 and the pad oxide layer 14 exposing the surface of the substrate. The first opening is defined by sidewalls of the pad oxide layer 14 and sidewalls of the insulating layer 18. The first opening 19 preferably has an open dimension (e.g., width) in a range of between about 0.15 and 1.0 μm and a length in a range of between about 0.15 and 10,000 μm.

Figure 2:
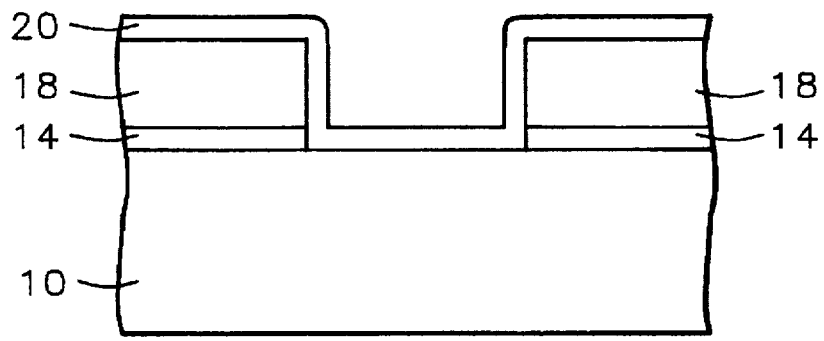

As shown in FIG. 2, an etch buffer layer 20 is formed over the resultant surface. The etch buffer layer 20 can be also be made from polysilicon or amorphous silicon and is more preferably composed of polysilicon. The etch buffer layer can be composed of any material with a different etch rate/characteristics than the silicon substrate. The etch buffer layer 20 composed of polysilicon preferably has a thickness in a range of between about 300 and 500 Å.

The etch buffer layer 20 composed of polysilicon is preferably formed by a LPCVD process using at a pressure between about 10 and 350 mtorr at a temperature between about 400° and 620° C.

The etch buffer layer can be characterized by comparing the etch rate of the etch buffer layer to the etch rate of the substrate. For example, the etch buffer layer preferably has an etch rate of 80% to 120% of the etch rate of silicon (e.g., in a RIE etch) and more preferably between 80% and 100%.

Figure 3:
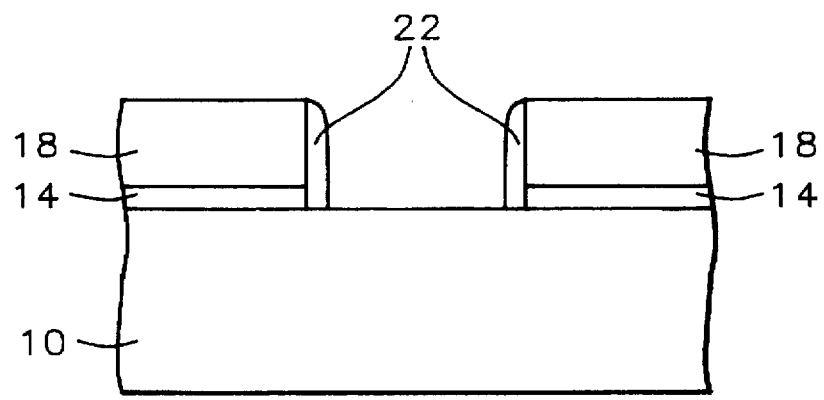
Figure 4:
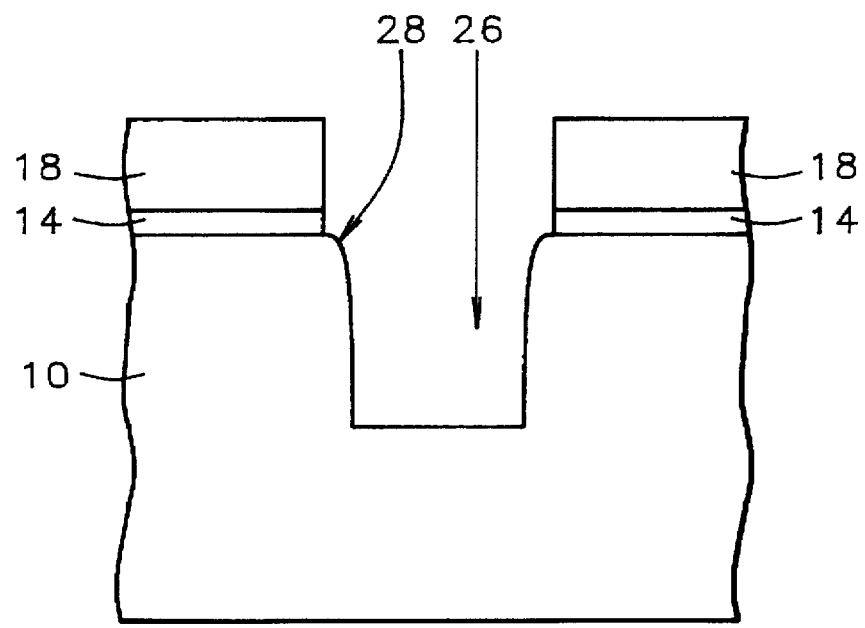

As displayed in FIGS. 3 and 4, preferably in one continuous etch step, a trench 26 is formed having rounded top corners 28. Referring to FIG. 3, the etch buffer layer 20 composed of polysilicon is anisotropically etching forming spacers 22 on the sidewalls of the pad oxide layer 14 and of the insulating layer 18. This exposes the substrate surface in the first opening 19.

Now referring to FIG. 4, the same etch step continues by etching the spacer 22 and the exposed substrate in the first opening 19 thereby forming a trench 26 in the substrate 10. Because the etch has to etch through the spacers 22 before it reached the substrate, the trench 26 has rounded top edges 28 near the pad oxide layer 14. The trench preferably has a depth in a range of between about 0.3 and 0.5 μm and a width in a range of between about 0.15 and 1.0 μm.

The etch of the etch buffer layer 20 composed of polysilicon, spacer 22 and the exposed substrate preferably comprises a dry etch using Cl$_2$/HBr reactants.

Figure 5:
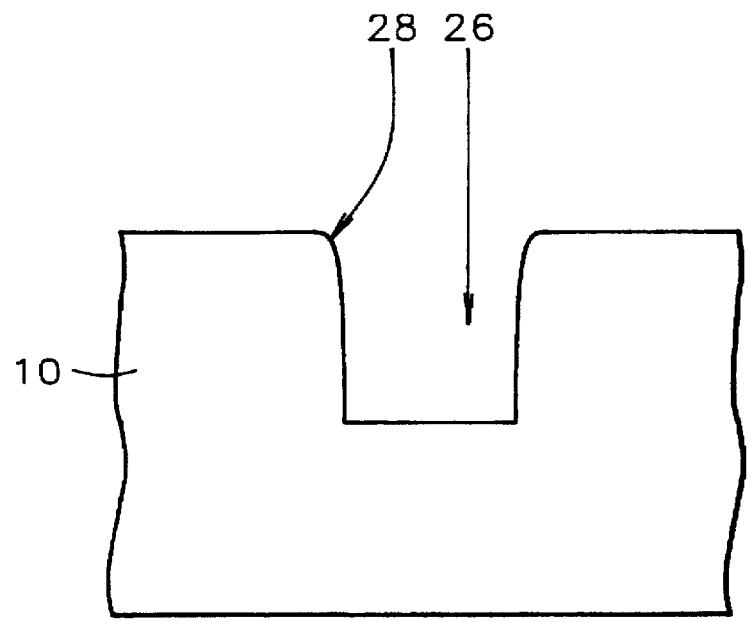

As shown in FIG. 5, the pad oxide layer 14 and the first insulating layer 18 are removed thereby forming the trench 26 with rounded top edges 28.

The pad oxide layer 14 is preferably removed using a wet etch comprising a 50:1 HF at a temperature between about 20° and 25° C. The first insulating layer 18 is preferably removed using a wet etch comprising hot H$_3$PO$_4$ at a temperature between about 175° and 185° C.

As shown in FIG. 6, the processing continues by forming a oxide over the substrate surface and filling the trench with oxide. The trench is preferably filled with oxide 32. A field implant is optionally performed and the substrate under the trench is doped.

Following this, FET devices are formed in an on the substrate. For example, PMOS and NMOS FET can be formed on the substrate surface and BC-FET (buried channel-FET) and SC-FET (surface channel-FET) devices can be formed in and on the substrate. See FIG. 6. For example, a gate oxide layer 36 can be formed over the substrate surface. The gate oxide layer 36 preferably has a thickness in a range of between about 35 and 75 Å. The gate oxide layer is preferably formed by a thermal oxidation process. Note that the gate oxide has a uniform thickness near the top corners of the trench because of the rounded top corners 28 of the invention. The trench 30 can then be filled with oxide.

Also, field effect transistors are formed over the gate oxide in the active areas. The rounded corners 28 of the trench prevent parasitic field FET's and improve the isolation capabilities of the trench.

The present invention provides an improved method to form a trench with rounded top edges. The rounded top edges will allow proper formation of gate oxide around the trench and reduce parasitic field FET problems. The method is inexpensive to implement and reliable to manufacture.

While the invention has been particularly shown and described with reference to the preferred embodiments thereof, it will be understood by those skilled in the art that various changes in form and details may be made without departing from the spirit and scope of the invention.

What is claimed is:

1. A method of fabricating trench with rounded corners in a substrate comprising the steps of:
   a) forming a pad layer over a semiconductor substrate;
   b) forming an insulating layer over said pad layer;
   c) forming a first opening in said insulating layer and said pad layer exposing the surface of said substrate; said first opening defined by sidewalls of said pad layer and sidewalls of said insulating layer;
   d) forming a silicon etch buffer layer over the substrate surface;
   e) anisotropically etching said etch buffer layer forming spacers on said sidewalls of said pad layer and of said insulating layer and exposed said substrate, and etching said spacers and the exposed substrate in said first opening forming a trench in said substrate; said trench having rounded top edges near said pad layer; and
   f) removing said pad layer and said first insulating layer thereby forming said trench with rounded top edges wherein the anisotropically etching in step e) comprises a dry etch using Cl$_2$ and HBr.

2. The method of claim 1 which further includes:
   a) filling said trench with a dielectric layer composed of silicon oxide,
   b) forming a gate oxide over said substrate; and
   c) forming field effect transistors over said gate oxide layer.

3. The method of claim 1 wherein said silicon etch buffer layer is composed of a material selected from the group consisting of amorphous silicon and polysilicon.

4. The method of claim 1 wherein said pad layer is composed of silicon oxide and has thickness in a range of between about 70 and 200 Å.

5. The method of claim 1 wherein said insulating layer is composed of silicon nitride having a thickness in a range of between about 1000 and 2000 Å.

6. The method of claim 1 wherein said first opening has an open dimension in a range of between about 0.15 and 1.0 μ.

7. The method of claim 1 wherein said etch buffer layer is composed of polysilicon having a thickness in a range of between about 300 and 500 Å.

8. The method of claim 1 wherein said pad layer is removed using a dilute HF etch at a temperature between about 175° and 185° C. and said first insulating layer is removed using a hot H$_3$PO$_4$ etch.

9. A method of fabrication a trench with rounded corners in a substrate comprising the steps of:
   a) forming a pad layer composed of silicon oxide over a semiconductor substrate; said semiconductor substrate having isolation areas and active areas;
   b) forming an insulating layer composed of silicon nitride over said pad layer;
   c) forming a first opening in said insulating layer and said pad layer exposing the surface of said substrate over said isolation area, said first opening defined by sidewalls of said pad layer and of said insulating layer; said first opening having an open dimension in a range of between about 0.15 and 1.0 μ;
   d) forming an etch buffer layer composed of polysilicon over the substrate surface, said etch buffer layer composed of polysilicon having a thickness in a range of between about 300 and 500 Å;
   e) anisotropically etching said etch buffer layer forming spacers on said sidewalls of said pad layer and of said insulating layer, and etching said spacer and the exposed substrate in said first opening forming a trench in said substrate, said trench having rounded top edges near the pad layer; said trench having a depth in a range of between about 0.3 and 0.5 μm; and
   f) removing said pad layer and said first insulating layer thereby forming said trench with rounded top edges wherein the anisotropically etching in step e) comprises a dry etch using using Cl$_2$ and HBr.

10. The method of claim 9 which further includes:
    a) filling said trench with an dielectric layer composed of silicon oxide,
    b) forming a gate oxide over said substrate; and
    c) forming field effect transistors over said gate oxide layer over said active areas.

11. The method of claim 9 wherein said etch buffer layer is composed of a material selected from the group consisting of amorphous silicon and polysilicon.

12. The method of claim 9 wherein said pad layer is composed of silicon oxide and has thickness in a range of between about 70 and 200 Å.

13. The method of claim 9 wherein said insulating layer is has a thickness in a range of between about 1000 and 2000 Å.

14. The method of claim 9 wherein said pad layer is removed using a dilute HF etch at a temperature between about 175° and 185° C. and said first insulating layer is removed using a hot H$_3$PO$_4$ etch.

* * * * *